United States Patent [19]

Sandy et al.

[11] 4,155,057
[45] May 15, 1979

[54] SURFACE ACOUSTIC WAVE RING FILTER

[75] Inventors: Frank Sandy, Lexington; Manfred B. Schulz, Sudbury, both of Mass.

[73] Assignee: Raytheon Company, Lexington, Mass.

[21] Appl. No.: 847,271

[22] Filed: Oct. 31, 1977

Related U.S. Application Data

[63] Continuation of Ser. No. 668,373, Mar. 19, 1976, abandoned.

[51] Int. Cl.² .................. H03H 9/26; H03H 9/30; H03H 9/04
[52] U.S. Cl. ................................ 333/195; 310/313; 333/186
[58] Field of Search .............. 333/72, 30 R, 70 T, 333/1, 6, 10; 310/313; 29/25.35, 594; 331/107 A

[56] References Cited

U.S. PATENT DOCUMENTS

| | | | |
|---|---|---|---|
| 3,568,102 | 3/1971 | Tseng | 333/30 R |
| 3,582,838 | 6/1971 | De Vries | 333/72 |
| 3,611,203 | 10/1971 | Cooper | 333/30 R |
| 3,883,831 | 5/1975 | Williamson et al. | 333/30 R |
| 3,967,221 | 6/1976 | Cooper et al. | 333/30 R |
| 3,983,517 | 9/1976 | Weglein | 333/72 |
| 3,999,147 | 12/1976 | Otto et al. | 333/72 X |

Primary Examiner—Alfred E. Smith
Assistant Examiner—Marvin Nussbaum
Attorney, Agent, or Firm—M. D. Bartlett; J. D. Pannone; H. W. Arnold

[57] ABSTRACT

A surface acoustic wave low loss filter device having input and output transducers located along opposed sides of a rectangular propagation path with frequency selective reflective gratings at each of the four corners of the rectangle. Two traveling surface waves traverse the device along opposed paths encountering frequency filtering at the gratings. The two waves arrive at the output transducer additively in phase eliminating the bidirectionality loss normally associated with surface acoustic wave devices. At frequencies for which the gratings are reflective there can be nearly lossless transmission from input to output. At all other frequencies, transmission between input and output transducers is negligible. The device has high sidelobe rejection, adjustable passband skirt slopes, and an adjustable bandwidth.

26 Claims, 4 Drawing Figures

SURFACE ACOUSTIC WAVE RING FILTER

CROSS-REFERENCE TO RELATED CASES

This is a continuation of application Ser. No. 668,373, filed Mar. 19, 1976, now abandoned.

BACKGROUND OF THE INVENTION

1. Field of the Invention

The invention pertains to a surface acoustic wave filter device. The invention particularly pertains to a bandpass surface acoustic wave filter having a relatively low insertion loss and high out-of-band rejection.

2. Description of the Prior Art

Surface acoustic wave devices have been used previously for bandpass filters. Often it was desired to provide a bandpass device having a low insertion loss for numerous applications such as in the RF stages of a radio frequency receiver. Attempts to achieve this goal included surface acoustic wave resonators and the use of unidirectional transducers. These are both low loss but the SAW resonator is necessarily a very small bandwidth and is difficult to design for good sidelobe suppression along with good passband shape. Unidirectional transducers suffer from a number of disadvantages depending on the technique used. For example, the earliest approach using two transducers driven in quadrature had very narrow bandwith and passband shaping could not be done. More recently, three phase transducers have been used but very complex fabrication involving multiple layers is required. That is, electrodes must be overlapped which will cause difficulty with fabrication yield and reliability.

In previous ordinary transversal surface wave filters, a 3 db loss was occasioned at both input and output transducers due to loss of half of the energy coupled into or out of the device by the transducer. With most devices, a surface wave is launched in each of two directions from the input transducer. Surface waves in only one of these directions ever reach the output transducer, the surface waves in the other direction being absorbed or dissipated at one edge of the device. At the output transducer, only approximately half of the energy was coupled into the output transducer. Thus, such devices had a minimum attainable insertion loss of at least 6 db not including the dissipation losses in the material itself.

SUMMARY OF THE INVENTION

Accordingly, it is an object of the present invention to provide a surface acoustic wave device having a broader passband than a resonator.

Also, it is an object of the present invention to provide such a device with a very low insertion loss.

Furthermore, it is another object of the present invention to provide such a device having a center operating frequency higher than has heretofore been obtained with bulk wave resonators.

It is a further object of the invention to provide such a device which is both simple and inexpensive to fabricate.

These as well as other objects of the invention may be met by providing a surface acoustic wave device which comprises in combination a substantially planar layer capable of supporting surface wave propagation thereon and at least one input transducer which is coupled to the layer and which produces surface waves upon excitation in the layer in a plurality of directions, and an output transducer which is also coupled to the layer which is adapted for receiving the surface waves from each of the plurality of directions. The surface waves preferably arrive at the output transducer additively in phase for a predetermined range of frequencies within the passband of the device. Means may further be provided for varying the direction of the surface waves upon the planar layer, the direction varying means preferably directing the surface waves from each of the plurality of directions toward the output transducer. The direction varying means can comprise a plurality of grooves in the planar layer or a plurality of conductive or non-conductive strips upon the surface of the layer. In all embodiments, the planar layer preferably comprises piezoelectric material such as lithium niobate, lithium tantalate, quartz, or other type of piezoelectric material. Means may also be provided for varying the temperature coefficient of delay of the device. In one such embodiment, a layer of silicon dioxide having a preferred thickness is placed over a lithium niobate or lithium tantalate piezoelectric planar layer.

Objects of the invention may also be met by providing a surface acoustic wave device which comprises in combination a substrate of piezoelectric material, at least one input transducer coupled to the substrate for producing surface waves on the substrate wherein the input transducer produces surface waves propagating away from the transducer in at least two directions, an output transducer which is also coupled to the substrate and which is adapted for receiving the surface waves produced by the input transducer from both of the tow directions, and a plurality of means for reflecting the surface waves from each of the two directions toward the output transducer, the surface waves of a frequency within a predetermined range being additive at the output transducer. Preferably, the reflecting means are four in number wherein each of the reflecting means comprises a plurality of substantially parallel reflecting strips. The reflecting strips reflect surface waves of a frequency only substantially within the predetermined range. In preferred embodiments, the reflecting means are located on the substrate in a substantially rectangular configuration wherein one of each of the four reflecting means is located at each corner of a rectangle. The input transducer is then located between two of the reflecting means with the output transducer located between the other two of the reflecting means. The reflecting strips may comprise grooves cut into the substrate in which the depths of the grooves may be varied within each of the reflecting means or wherein the length of the groove is varied or wherein the spacing between adjacent grooves is varied or with any combination of these. The reflecting means may also comprise reflecting metal or dielectric strips coupled to the substrate wherein either the width of the strips or the length of the strips or the spacing between adjacent ones of the strips is varied in order to obtain the desired frequency response. The combination may further include a load impedance means coupled to the output transducer. The load impedance means preferably comprises an impedance substantially equal to the complex conjugate of the impedance of the output transducer. That is, the real part of the impedance of the load is substantially equal to the real part of the impedance of the output transducer and the complex or imaginary portion of the load impedance is substantially equal in magnitude but opposite in sign to the imaginary portion of the impedance of the output transducer.

The invention may also be practiced by providing the combination of a substrate of piezoelectric material, at least one input transducer coupled to the substrate in which the input transducer produces surface waves on the substrate in a plurality of directions, an output transducer coupled to the substrate wherein the output transducer receives surface waves from each of the directions, means for directing the surface waves from each of the directions toward the output transducers in which the directing means reflect surface waves having a frequency response only within a predetermined range of frequencies, means for coupling electrical signals to the input transducer, a load impedance means coupled to the output transducer having an impedance substantially equal to the complex conjugate of the impedance of the output transducer, and output signal utilization means. The means for coupling the electrical signals to the input transducer may comprise in preferred embodiments means for coupling signals from antenna means to the input transducer. The output signal utilization means may further comprise amplifier means for amplifying signals from the output transducer. The output signal utilization means may further comprise a radio receiver means including mixer, oscillator, one or more IF stages, detector, and output amplifiers.

Still further, the invention may be practiced by a method which comprises the steps of producing surface waves on piezoelectric substrates in a plurality of directions, reflecting the surface waves from each of the directions toward output transducer means wherein the reflected surface waves have a frequency only within a predetermined range of frequencies, and receiving the reflected surface waves at the output transducer means, the reflected surface waves being substantially absorbed by the output transducer means. The method may further comprise the step of reflecting the surface waves with a plurality of substantially parallel reflecting strips. Electrical signals may be coupled to the input transducer while the output signals from the output transducer are amplified for use in other portions of the circuitry.

DESCRIPTION OF THE PREFERRED EMBODIMENT

Figure 1:
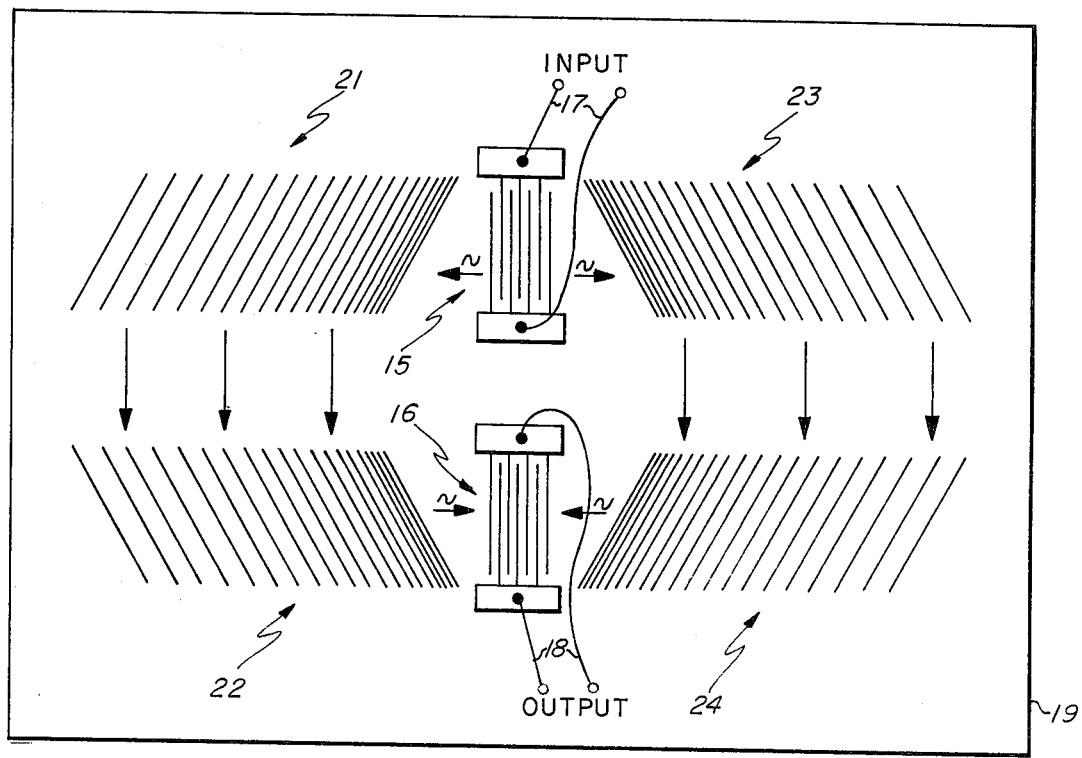
FIG. 1 is a planar view of a first device embodying the invention.

FIG. 1 shows a planar view of a surface acoustic wave filter device in which the present invention is used to advantage. The device is constructed upon a substantially planar surface at substrate 19 which is a material capable of supporting surface wave propagation. Lithium niobate, lithium tantalate, quartz, and other piezoelectric materials are preferred materials for substrate 19 although non-piezoelectric materials may be used with a piezoelectric overlay.

Input electrical signals are coupled from input leads 17 to input transducer 15. Input transducer 15 may be constructed in accordance with well-known principles so as to produce surface acoustic waves upon the surface of substrate 19 over the bandwidth of frequencies for which the device is to be designed to operate. Surface waves having substantially equal magnitude are propagated away from input transducer 15 in two directions as indicated by arrows. Both surface waves propagate away from input transducer 15 in opposed directions until reaching first and second frequency selective reflective gratings 21 and 23. Frequency selective reflective gratings 21 and 23 are spaced equal distances from input transducer 15. Both surface waves are reflected at a substantially 90° angle from reflective gratings 21 and 23 toward reflective gratings 22 and 24 respectively. Reflective gratings 22 and 24 again reflect the surface waves at a substantially 90° angle toward output transducer 16 spaced equidistantly between reflective gratings 22 and 24.

Reflective gratings 21-24 are both frequency selective and frequency dispersive. That is, surface waves having a frequency only within a predetermined bandwidth of frequencies are reflected and surface waves propagating from grating 21 toward grating 22 and from grating 23 toward grating 24 have a spatial frequency dependence. For example, portions of the surface wave having a frequency in the upper portion of the passband propagate from grating 21 to grating 22 and from grating 23 to grating 24 nearer to the center of the device than surface waves having a lower frequency. Surface waves having the lowest frequency within the predetermined passband propagate between gratings at the outer edges of the gratings.

Because of the symmetry of the device, the two surface waves incident upon output transducer 16 arrive in phase. That is, the arriving surface waves add in amplitude at output transducer 16 to produce an output signal having twice the amplitude than if only a single such surface wave were to be incident upon output transducer 16. If both the input and output transducers are properly impedance matched to the source and load, very low insertion loss will result. In previously known surface acoustic wave filter devices, only half of the surface waves launched by the input transducer ever reached the output transducer. Thereby a 3 db loss was occasioned at the input transducer and by reciprocity another 3 db was lost at the output transducer for a total of 6 db.

Figure 2:
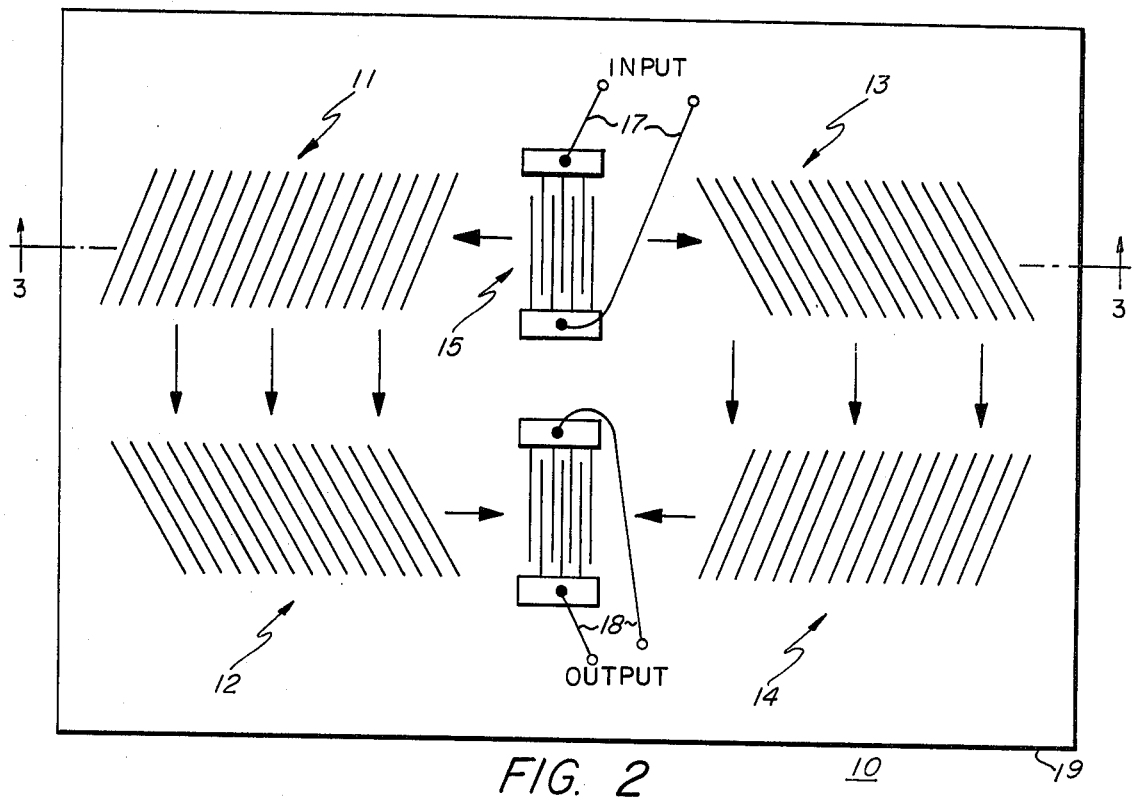
FIG. 2 is a planar view of a second device embodying the invention.

Reflective gratings 21-24 may be constructed using a number of different techniques. As shown in the cross-sectional view of FIG. 3, reflective gratings 21-24 are each formed as a number of substantially parallel grooves etched into piezoelectric substrate 19. The depth of the grooves is varied. The depth of the grooves is determined by well-known techniques to shape the reflection band to a desired frequency response. The grooves may be cut into a piezoelectric substrate by ion beam etching, chemical etching, or any other desired method. The frequency at which the grooves are reflective may be varied by varying the spacing of the grooves. Devices may be constructed by varying both the length and depth of the grooves in order to obtain a preferred frequency response characteristic. Alternatively, reflective gratings 21-24 may be constructed as reflective strips placed upon the surface of substrate 19. The reflective strips may be formed from a metal or a dielectric material or any other material that will cause reflections of surface waves upon a piezoelectric substrate. The spacing, width and/or the length of the reflective strips may be varied in order to obtain the desired frequency reflection characteristics. In still a further embodiment of the invention, such as is shown in the view of FIG. 2, reflective gratings 11–14 are formed by either reflective grooves or strips, the spacing between the grooves or strips being constant. In this case the impulse response characteristic of the device is determined by the number of reflective strips and the reflective strength of each strip. Of course, any combination of these techniques may be used in accordance with the desired frequency response of the device.

Figure 3:
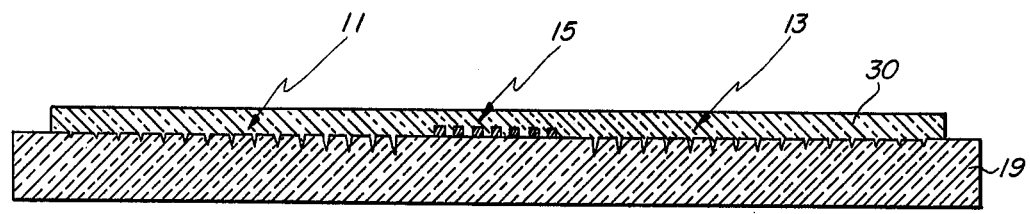
FIG. 3 is a cross-sectional view of one embodiment of the device in FIG. 2.

Temperature compensation may be provided in embodiments of the device to provide substantially constant response characteristics over a broad range of temperatures. A preferred means for providing temperature compensation is shown in the view of FIG. 3. A layer of silicon dioxide 30 is deposited over substrate 19 including the input and output transducers and reflective gratings. This technique of temperature compensation is disclosed in United States Patent Application Ser. No. 538,478, filed on Jan. 3, 1975 and allowed on Jan. 16, 1976 and assigned to the present assignee, the specification thereof being herein incorporated by reference. As disclosed in that application, lithium niobate and lithium tantalate are the preferred materials for use with a silicon dioxide temperature compensating layer. The thickness of silicon dioxide layer 30 is determined in the manner disclosed in the allowed patent application such that the temperature coefficient of delay between input and output transducers is substantially constant or changes at a predetermined rate over a broad range of operating temperatures. In some embodiments of the invention, the temperature compensating layer may extend over only a portion of the device.

Referring now to the device shown in FIG. 1, it is a further advantage of the invention that frequency trimming, that is shaping or broadening of the passband of the device, may be easily accomplished. This permits provision of a single device for a number of applications with only minor modifications being made at the final fabrication step to achieve a specific bandwidth for a particular application. To provide this trimming, surface wave absorbing material is inserted between reflective gratings 21 and 22 and at corresponding symmetrical locations between reflective gratings 23 and 24 at spatial positions corresponding to frequencies desired to be eliminated from the passband. For example, if it is desired to eliminate a portion of the low frequency end of the passband, surface wave absorbing material is inserted between the reflective gratings on the sides of the gratings nearest the center for devices in which the reflective gratings reflect lower frequency surface waves from the inner portions and higher frequency surface waves at the outer portions. In cases where the lower frequencies are reflected from the outer portions of the reflective gratings, the surface wave absorbing material is placed between the reflective gratings at the outer portions thereof. Higher frequency portions of the passband may be eliminated by placing surface wave absorbing material at the opposite ends. Similar means may be used to change the impulse response of the device shown in FIG. 2.

Figure 4:
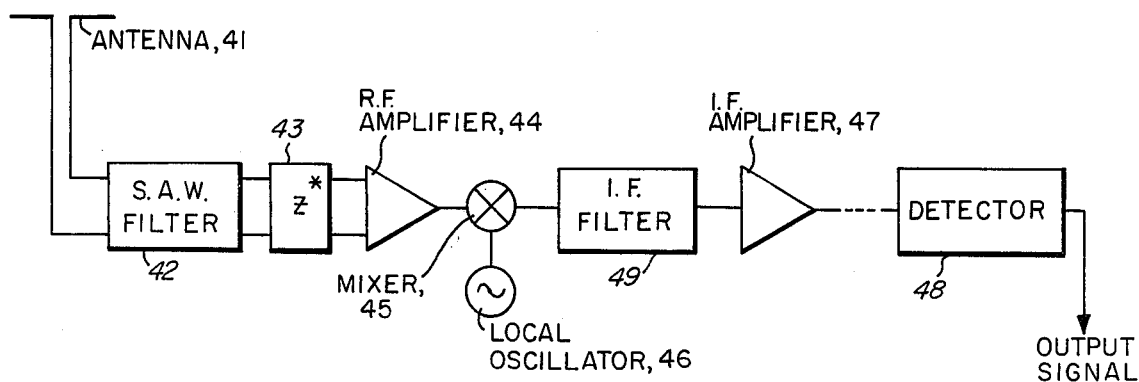
FIG. 4 is a block diagram of the receiver circuit in which the present invention is used to advantage.

Referring next to FIG. 4 there is shown a block diagram of a radio receiver circuit in which the present invention is used to advantage. Output signals from antenna 41 are coupled to the input terminals of the surface acoustic wave filter device 42 constructed in accordance with the principles of the invention. Surface acoustic wave filter devices using the invention are of particular advantage in this type of application in which a low level signal directly from an antenna is first filtered prior to any amplification because of the low loss properties of such devices. The output transducer of surface acoustic wave filter 42 is coupled to load impedance 43 which has an impedance $Z^*$ equal to the complex conjugate of the impedance of the output transducer. With this value of load impedance, suface waves arriving at the output transducer are entirely absorbed and hence no standing waves are produced which could cause a ripple characteristic within the passband of the device. The output signal as produced across load impedance 43 is coupled to RF amplifier 44 the output of which is coupled to mixer 45 to be beat against the signal from local oscillator 46 as in a super-heterodyne receiver of standard construction. The output signal from mixer 45 is filtered and amplified by IF filter 49 and IF amplifier 47. Further IF filters and amplifiers may be provided as desired. The output signal from the final IF amplifier is coupled to detector 48 which demodulates the output IF signal producing the output signal for utilization elsewhere in accordance with standard receiver design practice.

This completes the description of the preferred embodiment of the invention. Although preferred embodiments have been described, it is believed that numerous modifications and alterations thereof would be apparent to one having ordinary skill in the art without departing from the spirit and scope of the invention.

What is claimed is:

1. A surface acoustic wave device comprising in combination:
   a substantially planar layer capable of supporting surface wave propagation;
   at least one input transducer coupled to said layer for producing surface waves in said layer in a plurality of directions:
   means for reflecting said surface waves from each of said directions, said reflecting means reflecting surface waves only within a predetermined range of frequencies; and
   an output transducer coupled to said layer for receiving the surface waves reflected by said reflecting means, said surface waves arriving at said output transducer additively in phase for said predetermined range of frequencies.

2. The combination of claim 1 further comprising: means for varying the direction of said surface waves.

3. The combination of claim 2 wherein: said direction varying directs said surface waves toward said output transducer.

4. The combination of claim 3, wherein: said direction varying means reflects said surface waves in a predetermined range of frequencies.

5. The combination of claim 4 wherein: said direction varying means comprises a plurality of grooves in said layer.

6. The combination of claim 4 wherein: said direction varying means comprises a plurality of strips on said layer.

7. The combination of claim 4 wherein: said layer comprises piezoelectric material.

8. A surface acoustic wave device comprising in combination:
   a substrate of piezoelectric material;
   at least one input transducer coupled to said substrate for producing surface waves on said substrate, said input transducer producing surface waves propagating away from said transducer in at least two directions;

an output transducer coupled to said substrate for receiving said surface waves; and four reflecting gratings located on said substrate for reflecting said surface waves from each of said directions toward said output transducer, one of said reflecting gratings being positioned at each corner of a rectangle, surface waves of a frequency only within a predetermined range of frequencies being reflected by said reflecting means, said input transducer being located between two of said reflecting means and said output transducer being located between the other two of said reflecting means.

9. The combination of claim 8 wherein said reflecting gratings comprise:

grooves in said substrate.

10. The combination of claim 9 wherein:

the depth of said grooves is varied within each of said reflecting gratings.

11. The combination of claim 9 wherein:

the length of said grooves is varied within each of said reflecting gratings.

12. The combination of claim 9 wherein:

the spacing between adjacent grooves within each of said reflecting gratings is varied.

13. The combination of claim 8 wherein said reflecting gratings comprise:

metal strips coupled to said substrate.

14. The combination of claim 13 wherein:

the width of said metal strips is varied within each of said reflecting gratings.

15. The combination of claim 13 wherein:

the length of said metal strips is varied within each of said reflecting gratings.

16. The combination of claim 13 wherein:

the spacing between adjacent ones of said metal strips within each of said reflecting gratings is varied.

17. The combination of claim 8 further comprising:

load impedance means coupled to said output transducer.

18. The combination of claim 17 wherein said load impedance means comprises:

an impedance substantially equal to the complex conjugate of the impedance of said output transducer.

19. In combination:

a substrate of piezoelectric material;

at least one input transducer coupled to said substrate, said input transducer producing surface waves on said substrate in a plurality of directions;

an output transducer coupled to said substrate, said output transducer receiving said surface waves from each of said directions;

means for directing said surface waves from each of said directions to said output transducer, said directing means reflecting surface waves having a frequency only within a predetermined range of frequencies;

means for coupling electrical signals to said input transducer;

load impedance means coupled to said output transducer, said load impedance means having an impedance substantially equal to the complex conjugate of the impedance of said output transducer; and output signal utilization means coupled to said load impedance means and/or said output transducer.

20. The combination of claim 19 wherein said means for coupling said electrical signals to said input transducer comprises:

means for coupling signals from antenna means to said input transducer.

21. The combination of claim 19 wherein said output signal utilization means comprises:

amplifier means for amplifying signals from said output transducer.

22. The combination of claim 21 wherein said output signal utilization means comprises:

radio receiver means.

23. The method comprising the steps of:

producing surface waves on a piezoelectric substrate in a plurality of directions;

reflecting said surface waves from each of said directions toward output transducer means only within a predetermined range of frequencies; and receiving the reflected surface waves at said output transducer means, said reflected surface waves being substantially absorbed by said output transducer means.

24. The method of claim 23 wherein said step of reflecting comprises:

reflecting said surface waves with a reflecting grating.

25. The method of claim 24 further comprising the step of:

coupling input electrical signals to said input transducer.

26. The method of claim 25 further comprising the step of:

amplifying output signals from said output transducer.

* * * * *